United States Patent
Glass

(10) Patent No.: US 6,256,233 B1
(45) Date of Patent: Jul. 3, 2001

(54) DISTRIBUTED SIGNAL DRIVERS IN ARRAYABLE DEVICES

(75) Inventor: Richard J. Glass, Austin, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 08/474,856

(22) Filed: Jun. 7, 1995

Related U.S. Application Data

(62) Division of application No. 08/323,428, filed on Oct. 14, 1994, now Pat. No. 5,579,264, which is a continuation of application No. 08/097,805, filed on Jul. 26, 1993, now abandoned.

(51) Int. Cl.$^7$ ...................................................... G11C 7/00
(52) U.S. Cl. .................................. 365/189.05; 365/230.08
(58) Field of Search ........................... 365/189.05, 230.08

(56) References Cited

U.S. PATENT DOCUMENTS

| 3,868,657 | * | 2/1975 | Hoffman et al. | 365/230.08 |
| 4,110,639 | * | 8/1978 | Redwine | 365/230.08 |
| 5,134,583 | * | 7/1992 | Matsuo et al. | 365/189.05 |

* cited by examiner

*Primary Examiner*—A. Zarabian
(74) *Attorney, Agent, or Firm*—Wade James Brady, III; Frederick J. Telecky, Jr.

(57) ABSTRACT

Distributed buffering memory device (10) is provided which includes memory circuitry (12) located therein and independent buffering circuitry (16). Device (10) can be used in an array of devices where buffering circuitry (16) is employed to buffer the signals necessary for the array. Each independent buffer is employed to buffer a signal and supply that signal to a bank unique input bus which is used to drive the inputs of the array.

15 Claims, 2 Drawing Sheets

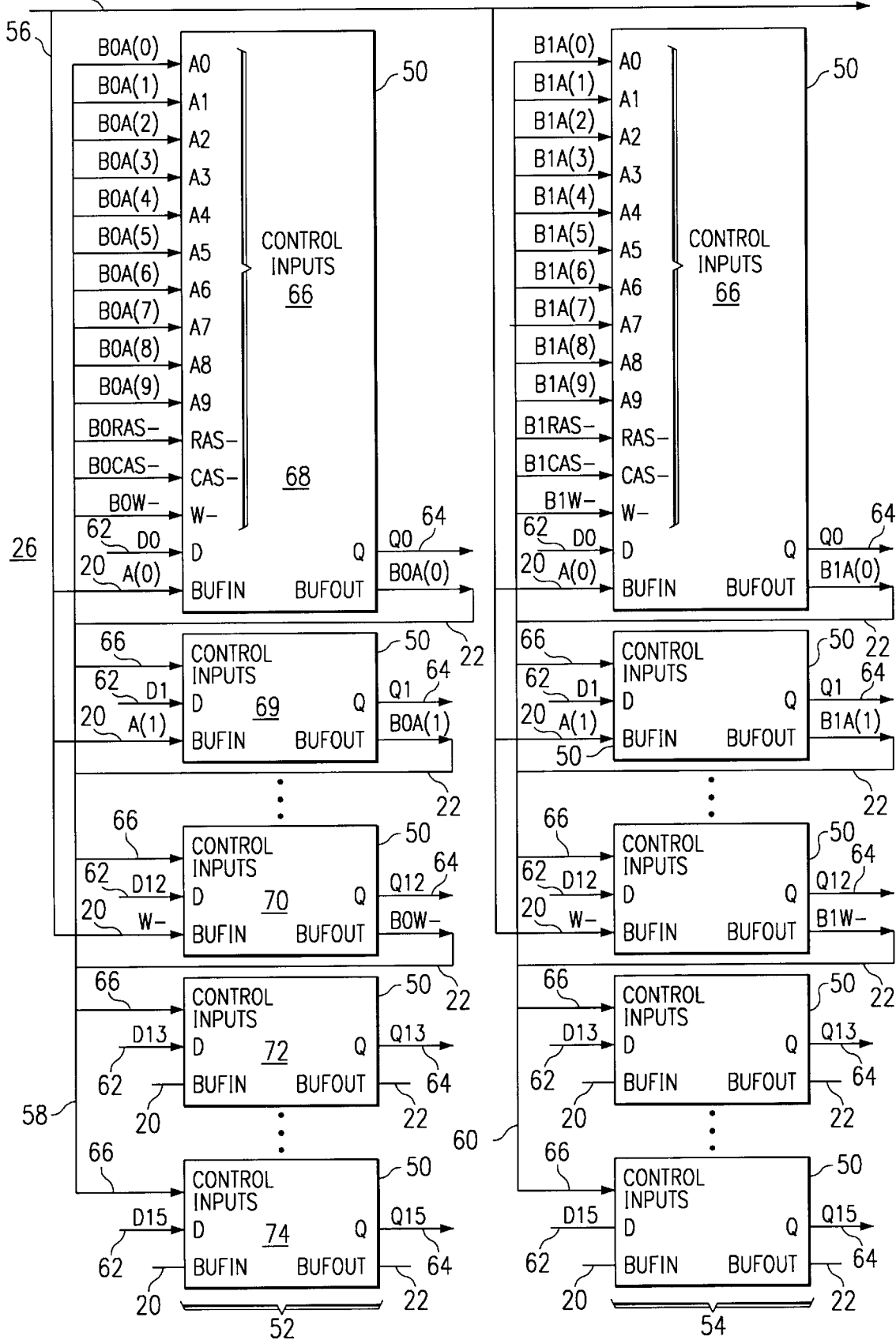

DISTRIBUTED SIGNAL DRIVERS IN ARRAYABLE DEVICES

This Appln is a Div of Ser. No. 08/323,428 filed Oct. 14, 1994, U.S. Pat. No. 5,579,264 which is a con't of Ser. No. 08/097,805 filed Jul. 26, 1993, Abn.

TECHNICAL FIELD OF THE INVENTION

This invention relates in general to the field of electronic devices, and more particularly to a device for use in a system with distributed buffering and a method for using same.

BACKGROUND OF THE INVENTION

In electronic systems, it is often desirable to provide arrays of devices assembled to form systems or subsystems. Typical arrays are composed of DRAM, SRAM, ROM, PROM or other memory devices. Access and control to the individual devices within these arrays are established by signals which contain the necessary information to access a particular device within the array of devices. In order to maintain proper control and access of the devices within the array, it is often necessary to buffer the control signals before they are applied to the devices in the array.

Past approaches to providing the necessary buffers for array control signals include using a separate buffering device for each of the control signals required. Therefore, if the control signal is comprised of N individual signals then the array would require a buffering device for each of the N signals in the control signal. This adds devices to the array which require board space and power.

Also, if field installation of additional banks to the array is desired, i.e. field expansion of memory size, then buffers for each potential expansion bank must be included in the base assembly. For example, if the base array includes only bank zero, designing the system to accommodate the field installation of banks 1–7, requires including buffers for each of the potential expansion banks 1–7, even though the expansion buffers are not in the base system. This makes the base array larger and more expensive than necessary for its initial application.

Providing proper drive current for the control signals in an array is sometimes also needed in an array. For example, in DRAM memory systems with multiple banks of devices, drivers are required for the address, mode, row-address-strobe (RAS), and column-address-strobe (CAS) inputs. Each DRAM device and its associated interconnecting printed wiring circuit presents capacitance to each signal input. For proper DRAM function each input signal must be driven with a fast and strong driver to charge and discharge the total line capacitance in a short time. Large DRAM arrays require redundant, high speed, high power drivers to achieve acceptable performance.

The traditional solution of using discrete buffers to buffer signals in arrays has numerous disadvantages. The individual discrete buffers occupy board space, and consume power and therefore generate localized heat buildup in the system. Discrete buffers in arrays with many signals buffered in the array also produce large localized power and ground current spikes when simultaneously switching. The additional signal conductor lengths required in the printed circuit board to route the signals to the buffers adds capacitance to the signal path. In systems with expansion capability, the additional buffers must be included in the original base system. Therefore, the base system includes additional buffers that are unnecessary to its initial operation adding to the cost of the base unit. Finally, including separate discrete buffers in the array adds to the array's cost.

SUMMARY OF THE INVENTION

Accordingly, a need has arisen for a device which includes an independent buffer for buffering signals in an array of devices. In accordance with the present invention, a device with an independent buffer is provided which substantially eliminates or reduces disadvantages and problems associated with prior devices.

The device includes functional circuitry for performing a desired function. The device also contains buffering circuitry which is independent from the functional circuitry, and the buffering circuitry can be used to buffer a signal. More specifically, the device of the present invention can be used in aggregate to form a system with distributed buffering. In such a system, an array of devices of the present invention are organized into banks of devices, e.g., a memory bank for providing data storage. Access and control of the individual devices within the array are achieved with control signals. The control signals are necessarily comprised of multiple bits of information. The number of bits required is a function of the number of devices within the array. In a distributed system using the device of the present invention, each bank in the array has a unique bank input bus to transmit buffered control signals from the buffers of the individual devices to the functional inputs of the devices. The unique bank input bus is formed of the combination of the outputs of the independent buffers from each device in the bank.

This invention provides several technical advantages over the traditional solution of using discrete buffers to buffer signals in arrays. Including the independent buffer within a device adds two pins to the device, but the increase is well within currently available packaging capabilities. Another technical advantage of the present invention is that it provides the independent buffering circuitry without substantially increasing the power consumption of the device.

Using the device of the present invention with independent buffering circuitry has several technical advantages when the device is used in an array of devices. Using the device of the present invention distributes the heat generated by the buffer throughout the array thereby eliminating localized heat buildup that occurs with using discrete buffers in an array system. Another technical advantage of the present invention in array applications is the reduction of localized power and ground transients by locating only one buffer in each array device. In array applications, including buffers within the array devices provides a technical advantage of simplifying array signal routing. Shorter signal conductor lengths in an array results in better performance of the array.

Including the individual buffers on the devices of the present invention in an array of devices provides a technical advantage of facilitating expansion of the array. Since each bank within an array provides its own buffering to the individual devices within the bank, the need to provide discrete buffers in the base system in anticipation of later expansion is eliminated. These technical advantages are achieved without using discrete buffering devices that require additional power and board space in an array of devices.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

FIG. 3 is a block diagram of a DRAM array with distributed array signal drivers.

DETAILED DESCRIPTION OF THE INVENTION

Figure 1:
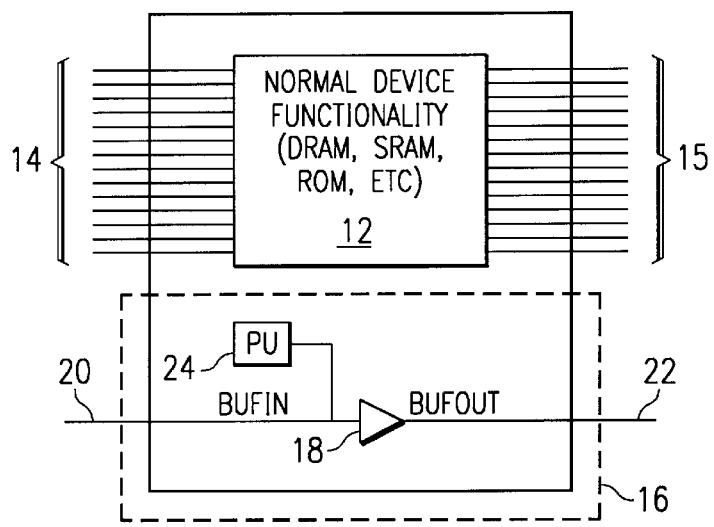
FIG. 1 illustrates a generalized block diagram of a device with an independent buffer.
Figure 2:
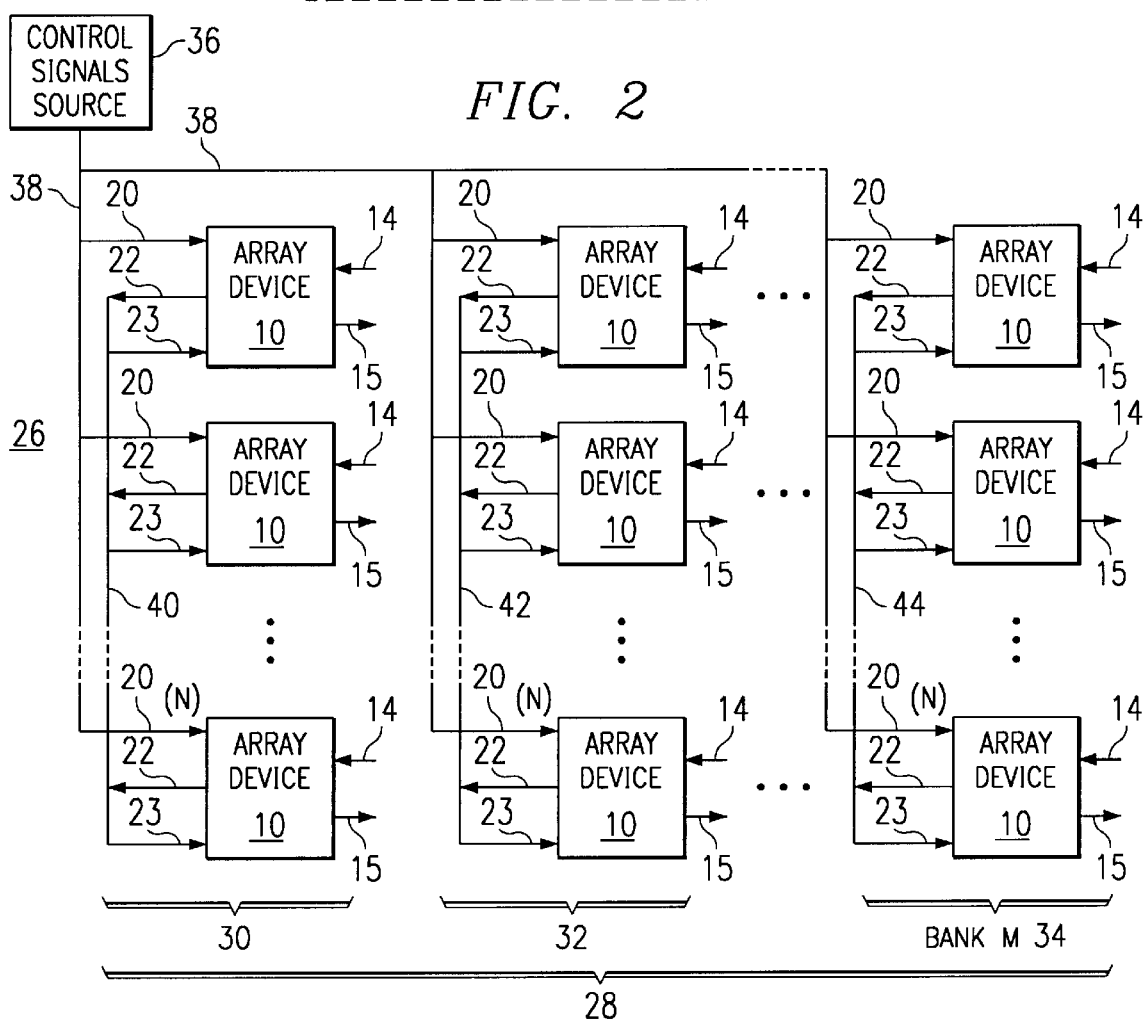
FIG. 2 is a generalized block diagram of a system with distributed array signal drivers.

The preferred embodiments of the present invention are illustrated in FIGS. 1–3 of the drawings, like numerals being used to refer to like and corresponding parts of various drawings.

FIG. 1 illustrates distributed buffering device 10. Device 10 includes functional circuitry 12 located therein. Functional circuitry 12 has functional inputs 14 and functional outputs 15. Device 10 also includes buffering circuitry 16. Buffering circuitry 16 includes buffer 18 with buffer input 20 and buffer output 22.

In device 10, functional circuitry 12 is independent from buffering circuitry 16. Functional circuitry 12 and buffering circuitry 16 share common power and ground pins only. In the preferred embodiment, buffering input 20 is connected to internal pull-up resistor 24 so as to isolate buffer 18 from system noise should buffering circuitry 16 be unconnected in the application of device 10.

Functional circuitry 12 can be any of many functions including DRAM, SRAM, various ROM and PROM families, as well as other digital devices. Other functionalities can be provided without affecting the inventive concept of the present invention.

In operation of the device of the present invention of FIG. 1, the signal to be buffered is input to the buffering circuitry 16 on buffer input 20, buffered by buffer 18, and output on buffer output 22. Typically, the buffering of the signal will enhances or alter a characteristic of the signal being buffered. For example, the voltage or current of the signal may be increased by the buffer. The functionality of buffering circuitry 16 can be any of those functions associated with buffers without affecting the inventive concept of the present invention.

FIG. 2 illustrates a generalized block diagram of distributed array 26 utilizing multiple devices 10. In the embodiment of the present invention shown in FIG. 2, multiple devices 10 are arranged into array 26. Array 26 is organized into multiple banks 28 of device 10. Multiple banks 28 includes first bank 30, second bank 32 on through to Bank-M 34.

Each bank of devices includes at least N devices 10 where N is the number of control signals on control signal bus 38. A bank must include a sufficient number of devices 10 with the independent buffering circuitry 16 to accommodate the number of control signals from control signal source 36 such that each signal is buffered by buffering circuitry 16 in individual device 10.

Each device 10 has functional unique input(s) 14, shared input(s) 23, and functional output(s) 15 to provide the necessary array functionality. For first bank 30, buffer input 20 of each device 10 is coupled to common control signal bus 38. Buffer output 22 of each device 10 is coupled to bank unique input bus 40. Bank unique input bus 40 is coupled to the buffered control signal input 23 of each of the individual devices 10 in first bank 30. The individual devices 10 of the remaining banks within array 26 are similarly connected and are not discussed in detail herein.

In operation of array 26 shown in FIG. 2 there are provided by control signal source 36 control signals with N-control signal bits. Each bank of devices within array 26 provides its own buffering of the control signals. This is accomplished by using buffering circuitry 16 of each device 10 in a bank to buffer and drive one of the control signals from the common control signal bus 38. Buffer output 22 of each device 10 within a bank is used to form a bank unique input bus. By this method is formed bank unique input bus 40 for first bank 30, second bank unique input bus 42 for second bank 32, and Bank-M unique input bus 44 for Bank-M 34.

The array of devices 26 shown in FIG. 2 could be dynamic random access memory (DRAM) devices, static random access memory (SRAM) devices, read only memory (ROM) devices, programmable read only memory (PROM) devices, logic devices or any other type of device that might be arranged in an array.

FIG. 3 is a block diagram of an example circuit using one mega-bit DRAMS which include the independent buffers of the present invention to allow for distributed buffering of the signal drivers to construct a multiple bank, 16-bit by 1,048, 576 word DRAM array 26. In DRAM array 26, there are multiple DRAM devices 50 organized into banks including first bank 52 and second bank 54. Array 26 could include banks up to Bank-M. Each DRAM device 50 includes buffer input 20, buffer output 22, data input 62, data output 64 and control inputs 66. DRAM devices 50 of the banks are coupled to control signal bus 56. Each bank of DRAM devices 50 includes a bank unique input bus comprised of the buffer output 22 of each of the individual devices 10 within the bank. Therefore, first bank 52 has first bank unique input bus 58 and second bank 54 has second bank unique input bus 60.

To properly control and access a one mega-bit DRAM arranged in the array of FIG. 3 requires thirteen (13) input control signals including address bits, A(0) through A(9), a row address strobe signal (RAS), a column address strobe (CAS) signal, and a right mode select (W) signal. Each of the control signals on control signal bus 56 is buffered for each bank by a DRAM device 50 in that bank. Each buffer provides the necessary drive for the corresponding inputs of all the other devices in the same bank. For example in first bank 52, address signal A(0) is coupled to DRAM device 68 at buffer input 20 and is buffered out of DRAM device 68 at buffer output 22 as buffered signal B0A(0). This signal is then applied to all DRAM devices 50 in first bank 52 by first bank unique input bus 58. Likewise, address signal A(1) is coupled to DRAM device 69 at buffer input 20 and is buffered out of DRAM device 69 at buffer output 22 as buffered signal B0A(1). This signal is then applied to all DRAM devices 50 in first bank 52 by first bank unique input bus 58. Similarly, each of the control signals on control signal bus 56 are buffered by individual DRAM devices 50 in first bank 52 to produce a corresponding set of buffered first bank signals.

The other banks in array 48 employ the same buffering technique. Each bank buffers its own row address strobe signal to produce a buffered row address strobe signal.

In the application shown in FIG. 3, there are more DRAM devices 50 in each bank than there are signals on control signal bus 56 that require buffering. Therefore, for individual DRAM devices 50 in a given bank greater than the number of control signals can be standard DRAM devices without independent buffering circuitry 16. If standardized device selection is desired, then buffer input 20 and buffer output 22 of DRAM device 50 can be left unconnected as indicated for devices 72 and 74. This is possible by including internal pull-up resistor 24 in the device as shown in FIG. 1.

By using distributed buffers in DRAM array 48, the need for external discrete drivers is eliminated. Also, DRAM array 48 can be expanded with additional banks of devices 50 with each bank providing its own buffering. This distributed buffering technique provides for incremental addition of buffers as additional banks are later installed.

Although the present invention has been described in detail, it should be understood that various changes, substitutions and alterations can be made hereto without departing from the spirit and scope of the invention as defined by the appended claims.

What is claimed is:

1. A device for use in an array of microcircuit devices, said array of devices having distributed buffering of control signals, each device requiring buffered control signals to be applied thereto, said array further including a network for distribution of said buffered control signals to said array of devices, each of said devices comprising:

functional circuitry for processing signals applied thereto; and a buffer circuit functionally independent from and residing on the same microcircuit as said functional circuitry, wherein each buffer circuit buffers one of a plurality of control signals, each said one buffered control signal being applied to said network for distribution to functional circuitry of devices of said array.

2. The device of claim 1, further comprising a pull-up resistor operable to isolate said buffer circuit when said buffer circuit is not connected in said system.

3. The device of claim 1, wherein said functional circuitry is memory circuitry.

4. The device of claim 3, wherein said functional circuitry is DRAM circuitry.

5. The device of claim 3, wherein said functional circuitry is SRAM circuitry.

6. The device of claim 3, wherein said functional circuitry is ROM circuitry.

7. The device of claim 3, wherein said functional circuitry is PROM circuitry.

8. A system with distributed buffering, comprising:

an array of devices organized into a plurality of banks and coupled to a plurality of control signals, each of said devices operable to perform a signal processing function with functional circuitry;

each of said devices further including a buffering circuit functionally independent from and residing on the same microcircuit as said functional circuitry, said buffering circuit operable to buffer a one of said control signals; and a bank input bus associated with each of said banks, wherein said buffered control signals are applied to said bank input bus, said bank input bus distributing said buffered control signals to functional circuitry of said devices within said bank to control the function of said devices.

9. The system of claim 8, wherein said devices further include a pull-up resistor operable to isolate said buffering circuit when said buffering circuit is not connected in said system.

10. The system of claim 8, wherein said devices are memory devices.

11. The system of claim 10, wherein said functional devices are DRAMs.

12. The system of claim 10, wherein said functional devices are SRAMs.

13. The system of claim 10, wherein said functional devices are ROMs.

14. The system of claim 10, wherein said functional devices are PROMs.

15. a system for distributing a plurality of buffered signals to functional circuitry of said system, said system comprising:

an array of devices, each device processing signals applied thereto; and a buffer circuit functionally independent of said device function circuit, said buffer circuit buffering signals applied thereto;

a first network for distributing each of a plurality of input signals to an associated device buffer circuit; and a second network having buffered signals from each associated device buffer circuit applied thereto, said second network distributing buffered signals to preselected device functional circuits;

wherein said device further includes a pull-up resistor operable to isolate said buffer circuit when said buffer circuit is not connected in the system.

* * * * *